(12) United States Patent
Ku et al.

(10) Patent No.: US 11,327,117 B2
(45) Date of Patent: May 10, 2022

(54) APPARATUS FOR ELECTRICITY MEASUREMENT OF FLOW BATTERY AND METHOD THEREOF

(71) Applicant: Institute of Nuclear Energy Research, Atomic Energy Council, Executive Yuan, R.O.C., Taoyuan (TW)

(72) Inventors: Hung-Hsien Ku, Taoyuan (TW); Ning-Yih Hsu, Taoyuan (TW); Chin-Lung Hsieh, Taoyuan (TW); Yi-Hsin Hu, Taoyuan (TW); Qiao-Ya Chen, Taoyuan (TW)

(73) Assignee: Institute of Nuclear Energy Research, Atomic Energy Council, Executive Yuan, R.O.C., Taoyuan (TW)

( * ) Notice: Subject to any disclaimer, the term of this patent is extended or adjusted under 35 U.S.C. 154(b) by 147 days.

(21) Appl. No.: 17/014,056

(22) Filed: Sep. 8, 2020

(65) Prior Publication Data

US 2022/0074996 A1    Mar. 10, 2022

(51) Int. Cl.
*G01R 31/36* (2020.01)
*H01M 8/18* (2006.01)
*H01M 8/04537* (2016.01)
*G01R 31/378* (2019.01)

(52) U.S. Cl.
CPC ....... *G01R 31/3644* (2013.01); *G01R 31/378* (2019.01); *H01M 8/04611* (2013.01); *H01M 8/188* (2013.01)

(58) Field of Classification Search
CPC ...... H01M 8/20; H01M 8/0662; H01M 8/188; H01M 4/36; H01M 8/0693; Y02E 60/10; Y02E 60/50

USPC ....... 324/400–426, 500, 600, 764.01, 103 R, 324/771, 761.01, 501, 639, 642, 702, 324/76.11, 76.66, 96

See application file for complete search history.

(56) References Cited

U.S. PATENT DOCUMENTS

| 2015/0226806 A1* | 8/2015 | Kim ..................... G01R 31/378 |
| | | 324/426 |
| 2016/0049673 A1* | 2/2016 | Fukushima ....... H01M 8/04186 |
| | | 324/426 |

* cited by examiner

*Primary Examiner* — Douglas X Rodriguez
*Assistant Examiner* — Trung Q Nguyen
(74) *Attorney, Agent, or Firm* — Demian K. Jackson; Jackson IPG PLLC

(57) ABSTRACT

An apparatus is provided for measuring the power of electrolytes at different positions of a flow battery by switching six-way valves without reconnecting channels. With the measurements at the positions, weighting is processed to obtain power corresponding to charging statuses for determining accurate power. The charging and discharging of voltage and current of the battery are controlled for constant operations with high efficiency. Consequently, the efficiency of power conversion is improved; energy consumption is reduced; and the battery is always run within a safe power-range for avoiding accidents or damages to the battery. In addition, the present invention is further applicable to a device monitoring the features of a battery unit. The six-way valves online monitor the power at center positions by switching. The values measured at different positions are aimed at the abnormality of the battery unit for processing adjustment or offline replacement to maintain best operation performance.

5 Claims, 7 Drawing Sheets

APPARATUS FOR ELECTRICITY MEASUREMENT OF FLOW BATTERY AND METHOD THEREOF

TECHNICAL FIELD OF THE INVENTION

The present invention relates to an apparatus for measuring electricity of flow battery; more particularly, to measuring power of electrolytes at different positions of a system by switching six-way valves only and to monitoring the power at different center positions of a battery unit at real time, where best operation performance of the system is maintained.

DESCRIPTION OF THE RELATED ARTS

A complete flow battery comprises a battery unit, an electrolyte tank at an anode end, and an electrolyte tank at a cathode end. Most electrolytes are stored in the tanks, where only a small part of the electrolytes is pumped to the battery unit 1 for electrochemical reactions and, then, returned back to the tanks after reactions. However, current prior arts of related apparatuses are mostly for measuring electrolyte power in battery unit. Therein, the power of the flow battery is contained in electrolyte; but, electrolyte runs in a system thoroughly so that it is impossible to trace its power at different positions through a fixed position only. The power obtained is thus different from that of the tanks. In another word, regarding the conventional apparatuses mostly for measuring the power of electrolyte in battery unit, it is impossible to trace the power of the whole flow battery at different positions. Hence, the prior art does not fulfill all users' requests on actual use.

SUMMARY OF THE INVENTION

The main purpose of the present invention is to process measurement online with fast speed and high precision, where, during the charging and discharging of a flow battery, power of electrolyte tanks and power at feeding outlets of a battery unit at outer positions or center positions are measured online; power at the positions are measured online by separately switching six-way valves; and values measured at the positions are weighted to be corresponding to the power of a system without affecting the operation of the battery unit for online controlling the charging and discharging of the battery unit.

Another purpose of the present invention is to be applied to a device monitoring the features of battery unit, where the six-way valves are switched to monitor the power of the battery unit at the center positions at real time; and values measured at the positions are aimed at the abnormality of the battery unit for processing adjustment or offline replacement to maintain best operation performance of the system.

To achieve the above purposes, the present invention is an apparatus of electricity measurement for flow battery, comprising at least one battery unit, at least two six-way valves, two circulating pumps, two electrolyte tanks, a power-measuring single cell, and two electrolyte collectors, where the battery unit has at least two feeding outlets and two material inlets to process electrochemical reactions to generate and/or discharge direct current based on electrolytes supplied and to output the electrolytes obtained after the electrochemical reactions; the feeding outlets are located at outer positions and center positions; the six-way valves separately connect to the feeding outlets of the battery unit; each of the six-way valves comprises six channels, being a first channel, a second channel, a third channel, a fourth channel, a fifth channel, and a sixth channel; the six channels are 3-input/3-output channels with each neighboring two channels interconnected and are fixed on corresponding one of the six-way valves to rotate around a circle center of the corresponding one of the six-way valves as following the corresponding one of the six-way valves; the first channel, the third channel, and the fifth channel are electrolyte inlets and the second channel, the fourth channel, and the sixth channel are electrolyte outlets; the circulating pumps separately connect to the material inlets of the battery unit and connect to corresponding ones of the electrolyte inlets of corresponding ones of the six-way valves; the electrolyte tanks separately connect to the circulating pumps to pump the electrolytes stored in corresponding ones of the electrolyte tanks to the battery unit through corresponding ones of the circulating pumps; the power-measuring single cell is connected between the second channel and the fifth channel of each of the six-way valves; during the charging and discharging of a flow battery, power of the electrolyte tanks and power at the outer positions or the center positions of the feeding outlets of the battery unit are measured online; power at different positions are measured online by separately switching the six-way valves; values measured at different positions are weighted to be corresponding to a system power; the six-way valves are separately switched to online monitor power at different positions of the battery unit; the values measured at different positions are obtained to process adjusting or online replacing in advance to the battery unit having an abnormal state to maintain best system performance; and the electrolyte collectors separately connect to the electrolyte outlets of the six-way valves and connect to the electrolyte tanks to collect corresponding ones of the electrolytes being shunted and having an unmeasured state or a measured state to be further flown into corresponding ones of the electrolyte tanks to be reused after being mixed. Accordingly, a novel apparatus of electricity measurement for flow battery is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
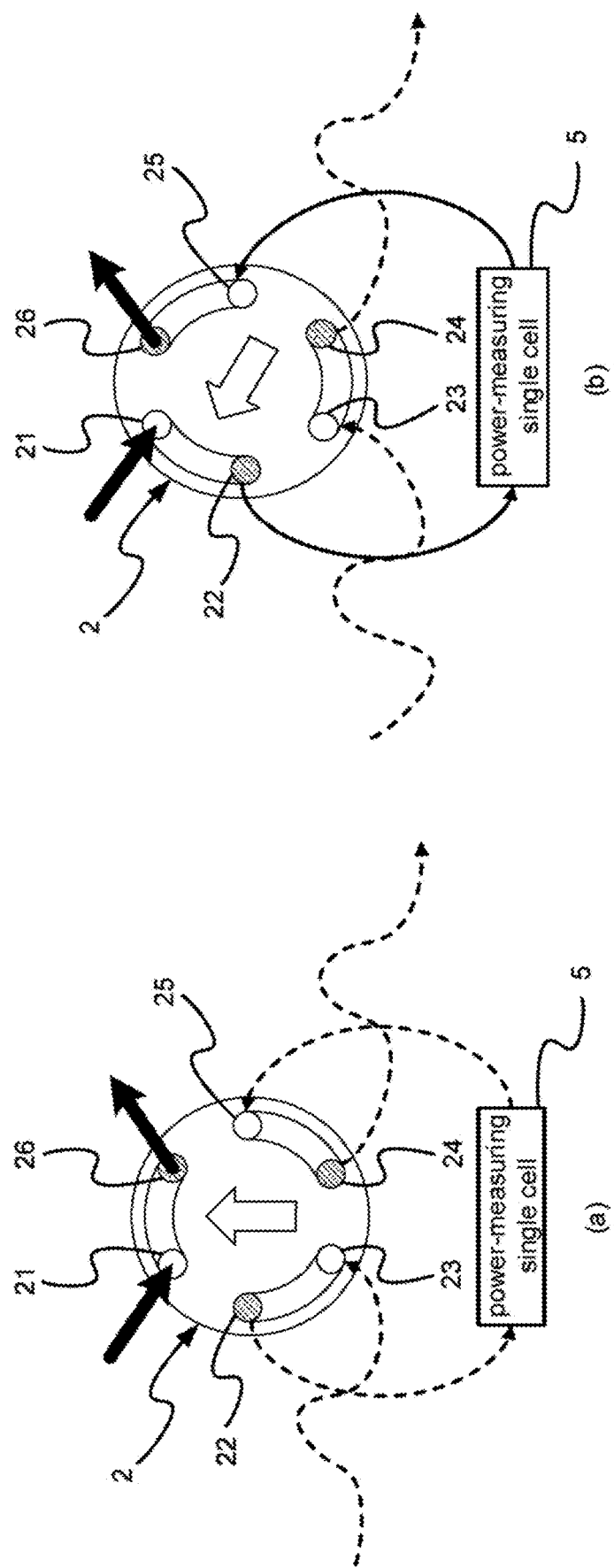
FIG. 1 is the structural view showing the preferred embodiment according to the present invention.

The following description of the preferred embodiment is provided to understand the features and the structures of the present invention.

Please refer to FIG. 1 to FIG. 7, which are a structural view showing a preferred embodiment according to the present invention; a structural view showing measurements of stored power of electrolyte tanks; a structural view showing measurements of a battery unit; a view showing selection of positions of the battery unit for measuring; a structural view showing measurements at center positions of the battery unit; a structural view showing measurements at outer positions of the battery unit; and a view showing an electrolyte collector. As shown in the figures, the present invention is an apparatus of electricity measurement for flow battery, comprising a battery unit 1, at least two six-way valves 2,2a, two circulating pumps 3,3a, two electrolyte tanks 4,4a, a power-measuring single cell 5, and two electrolyte collectors 6,6a.

The battery unit 1 has at least two feeding outlets and two material inlets to process electrochemical reactions to generate and/or discharge direct current based on electrolytes supplied and to output the electrolytes obtained after the electrochemical reactions, where the feeding outlets are located at outer positions and center positions.

Figure 2:
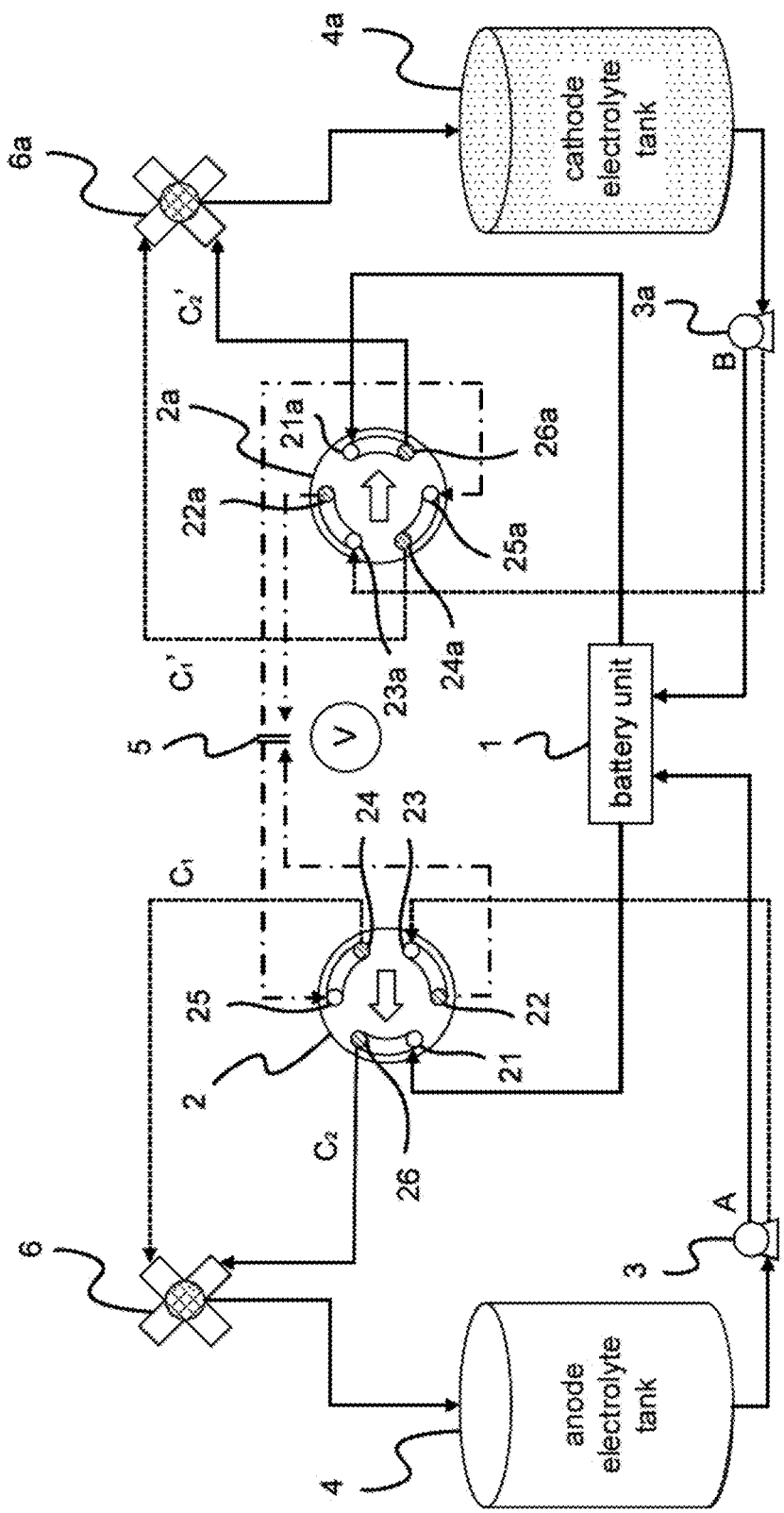
FIG. 2 is the structural view showing the measurements of the stored power of the electrolyte tanks.

The at least two six-way valves 2,2a separately connect to the feeding outlets of the battery unit 1, where, as shown in FIG. 1 and FIG. 2, each of the six-way valves 2,2a comprises six channels, being a first channel 21,21a, a second channel 22,22a, a third channel 23,23a, a fourth channel 24,24a, a fifth channel 25,25a, and a sixth channel 26,26a. The six channels are 3-input/3-output channels with each neighboring two channels interconnected and are fixed on a corresponding one of the six-way valves 2,2a to rotate around a circle center of the corresponding one of the six-way valves 2,2a as following the corresponding one of the six-way valves 2,2a, where the first channel 21,21a, the third channel 23,23a, and the fifth channel 25,25a are electrolyte inlets and the second channel 22,22a, the fourth channel 24,24a, and the sixth channel 26,26a are electrolyte outlets.

The two circulating pumps 3,3a separately connect to the material inlets of the battery unit 1 and connect to the electrolyte inlets of the six-way valves 2,2a as well.

The two electrolyte tanks 4,4a separately connect to the circulating pumps 3,3a to pump stored corresponding ones of the electrolytes to the battery unit 1 through corresponding ones of the circulating pumps 3,3a.

The power-measuring single cell 5 is connected between the second channel 22,22a and the fifth channel 25,25a of each of the six-way valves 2,2a, where, during the charging and discharging of a flow battery, power of the electrolyte tanks 4,4a and power at the feeding outlets of the battery unit 1 at the outer positions or the center positions are measured online; power of the electrolytes at different positions are measured online by switching each of the six-way valves 2,2a; values measured at different positions are weighted to be corresponding to a system power; the six-way valves 2,2a separately switch to monitor power online at different ones of the center positions of the battery unit 1; and the values measured at the positions are used to process adjusting or online replacing in advance for the battery unit 1 having an abnormal state to maintain best system performance.

The two electrolyte collectors 6,6a separately connect to the electrolyte outlets of the six-way valves 2,2a; and connect to the electrolyte tanks 4,4a for collecting the electrolytes being shunted and having an unmeasured state or a measured state to be further flown into corresponding ones of the electrolyte tanks 4,4a to be reused after being mixed.

Thus, a novel apparatus of electricity measurement for flow battery is obtained.

On using the present invention, the apparatus is designed to use the six-way valves 2.2a for choosing measurement targets by switching. As shown in FIG. 1 and FIG. 2, each of the six-way valves 2,2a has 3-input/3-output channels, where the white parts are the electrolyte inlets and the shaded parts are the electrolyte outlets. In the other word, the first channel 21,21a, the third channel 23,23a, and the fifth channel 25,25a are the electrolyte inlets; and the second channel 22,22a, the fourth channel 24,24a, and the sixth channel 26,26a are the electrolyte outlets. The power-measuring single cell 5 is connected between the second channel 22,22a and the fifth channel 25,25a. The power-measuring single cell 5 is functioned to use voltage. Because different power generates different voltage, the power of the power-measuring single cell 5 can be obtained through voltage measurement. Then, through a standard regression curve, a regression of the voltage and the power can be figured out. As a result, a voltage can be obtained to figure out a corresponding power. As shown in FIG. 1, the present invention uses the switching of the six-way valves 2.2a to choose measurement targets. By the switching, a measuring route can be changed from a broken line to a solid line shown in FIG. 2, FIG. 3, FIG. 5, and FIG. 6. When any one of the six-way valves 2 is switched to a state as shown in diagram (a) of FIG. 1, a broken line is used for measuring. Therein, the power-measuring single cell 5 is directed to along the broken line. On switching to the other state as shown in diagram (b) of FIG. 1, the power-measuring single cell 5 is directed to along the solid line.

Figure 3:
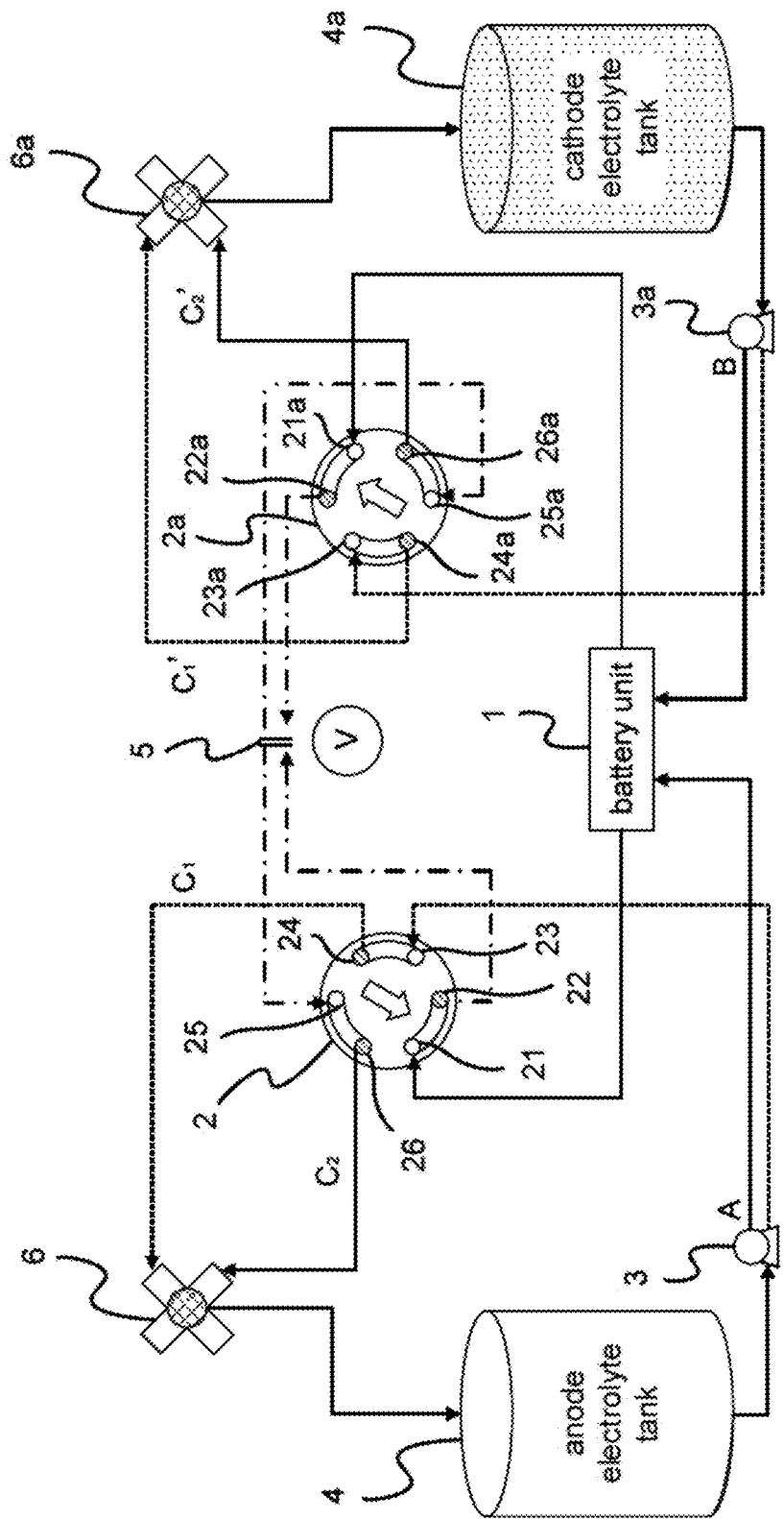
FIG. 3 is the structural view showing the measurements of the battery unit.

A complete flow battery comprises the battery unit 1, the electrolyte tank 4 at an anode end, and the electrolyte tank 4a at a cathode end. For measuring the electrolyte tanks 4,4a at the anode and cathode ends, an assembly is intra-connected as shown in FIG. 2. The assembly serially connects the power-measuring single cell 5 to obtain voltage outputting for measuring power stored in the electrolyte tanks 4,4a. As shown in FIG. 2, a preferred state is figured out. Most of the electrolytes are stored in the electrolyte tanks 4,4a with only a small part of the electrolytes is pumped to the battery unit 1 for electrochemical reactions and returned back to the electrolyte tanks 4,4a after the reactions. Thus, the present invention uses the states of the six-way valves 2,2a to measure the power of the electrolytes in the electrolyte tanks 4, 4a. Of course, as shown in FIG. 3, the state can be switched for measuring battery to measure the power of the electrolytes in the battery unit 1. Thus, the same functions of existing power-measuring devices in market are fulfilled, which can measure the power of the electrolytes in the battery unit 1. Nevertheless, the present invention can be changed to measure the power of the electrolytes in the electrolyte tanks 4, 4a by switching the six-way valves 2,2a only.

In a state-of-use, each of the six-way valves 2,2a has a first mode and a second mode. On switching the six-way valves 2,2a to the first mode, the electrolytes flow along a direction that the electrolytes flow from corresponding one of the electrolyte tanks 4,4a to corresponding ones of the circulating pumps 3,3a to pump corresponding ones of the electrolytes to enter corresponding one of the six-way valves 2,2a through corresponding ones of the third channels 23,23a and, then, through corresponding ones of the second channels 22,22a, enter the power-measuring single cell 5 for power-measuring. Thereafter, through corresponding ones of the fifth channels 25,25a, corresponding ones of the electrolytes are discharged out to corresponding ones of the six-way valves 2,2a through corresponding ones of the fourth channels 24,24a. At last, corresponding ones of the electrolytes flow back to be gathered in corresponding ones of the electrolyte tanks 4,4a through corresponding ones of the electrolyte collectors 6,6a, as shown in FIG. 2. On switching the six-way valves 2,2a to the second mode, the electrolytes flow along a direction that the electrolytes flow from corresponding ones of the electrolyte tanks 4,4a and, then, are pumped to the battery unit 1 by corresponding ones of the circulating pumps 3,3a and, then, enter corresponding ones of the six-way valves 2,2a through corresponding ones of the first channels 23,23a and, then, flows into the power-measuring single cell 5 through corresponding ones of the second channels 22,22a for power-measuring. Thereafter, through corresponding ones of the fifth channels 25,25a, the electrolytes are discharged to corresponding ones of the six-way valves 2,2a through corresponding ones of the sixth channels 26,26a. At last, the electrolytes flow back to be gathered in corresponding ones of the electrolyte tanks 4,4a through corresponding ones of the electrolyte collectors 6,6a, as shown in FIG. 3. Hence, the flows of the electrolytes are controlled by switching the six-way valves 2,2a to enter the power-measuring single cell 5 in a forwarding way or a reversing way.

Because the power-measuring of the battery unit 1 is related to the levels of chemical reactions processed with the electrolytes and the levels of the chemical reactions are related to the path lengths of the flows, the power measurement is related to the measured position of the battery unit 1. When the battery unit 1 has a big size, the center positions of the battery unit 1 itself as well as the positions at two ends of the battery unit 1 may differ in power. To avoid the difference owing to the measured positions, in another state-of-use, the present invention is designed to measure selected positions of the battery unit 1, which are the center positions of the battery unit 1, as shown in diagram (a) of FIG. 4, and the outer positions, as shown in diagram (b) of FIG. 4.

In this state-of-use, a six-way valve 2b,2c is separately added at the anode and cathode ends of a flow battery to sum up a total of four six-way valves 2,2a,2b,2c. On using, the center positions are used to measure the power at the anode and the cathode ends with alike-level reactions processed thereat. As referring to a system construction shown in FIG. 5 for measuring the power at the center positions of the battery unit 1, with two of the six-way valves 2b,2c switched to the first mode and the other two of the six-way valves 2,2a switched to the second mode, the electrolytes flow along a direction that the electrolytes flow from the corresponding ones of the electrolyte tanks 4,4a to corresponding ones of the feeding outlets of the battery unit 1 at corresponding ones of the center positions, and, then, flow to the power-measuring single cell 5 through corresponding ones of the circulating pumps 3,3a. The outer positions are used to measure the power at the anode and the cathode ends as various levels of reactions are processed thereat. As referring to another system connection shown in FIG. 6 for measuring the power at the outer positions, with all of the six-way valves 2,2a,2b,2c switched to the second mode, the electrolytes flow along a direction that the electrolytes flow from corresponding ones of the electrolyte tanks 4,4a to corresponding ones of the feeding outlets of the battery unit 1 at corresponding ones of the outer positions, and, then, flow to the power-measuring single cell 5 through corresponding ones of the six-way valves 2,2a,2b,2c.

Figure 7:
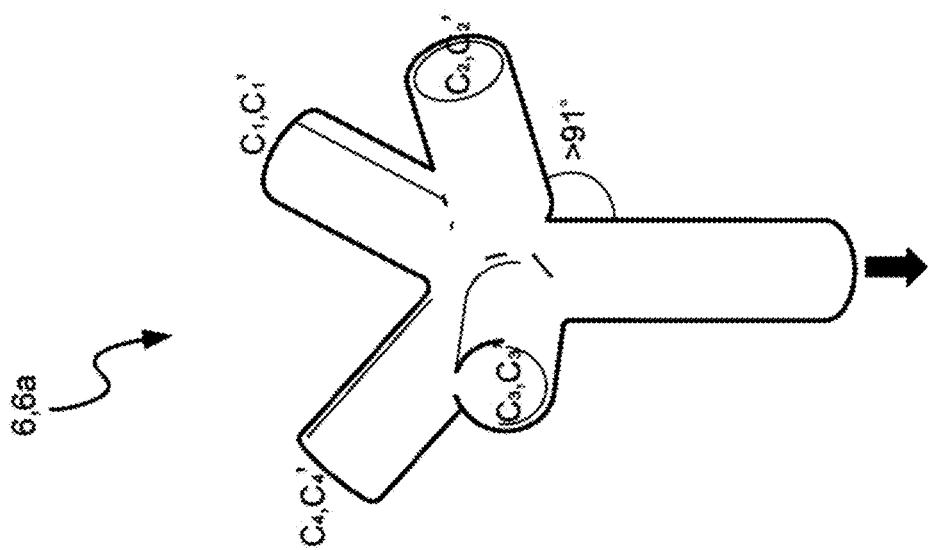
FIG. 7 is the view showing the electrolyte collector.

FIG. 7 shows the structure of each of the electrolyte collectors 6,6a. The electrolyte collectors 6,6a collect the electrolytes being shunted and having an unmeasured state or a measured state to be further flown into corresponding ones of the electrolyte tanks 4,4a to be reused after being mixed, whose design is shown in FIG. 7. Owing to the use of six-way valves, what are returned back are summed from all of the channels of $C_1$~$C_4$ and $C_1'$~$C_4'$ after testing and, thus, the electrolyte collectors 6,6a are devices for collecting the electrolytes, where the downward arrow shows the summing of an electrolyte to a corresponding electrolyte tank.

Figure 4:
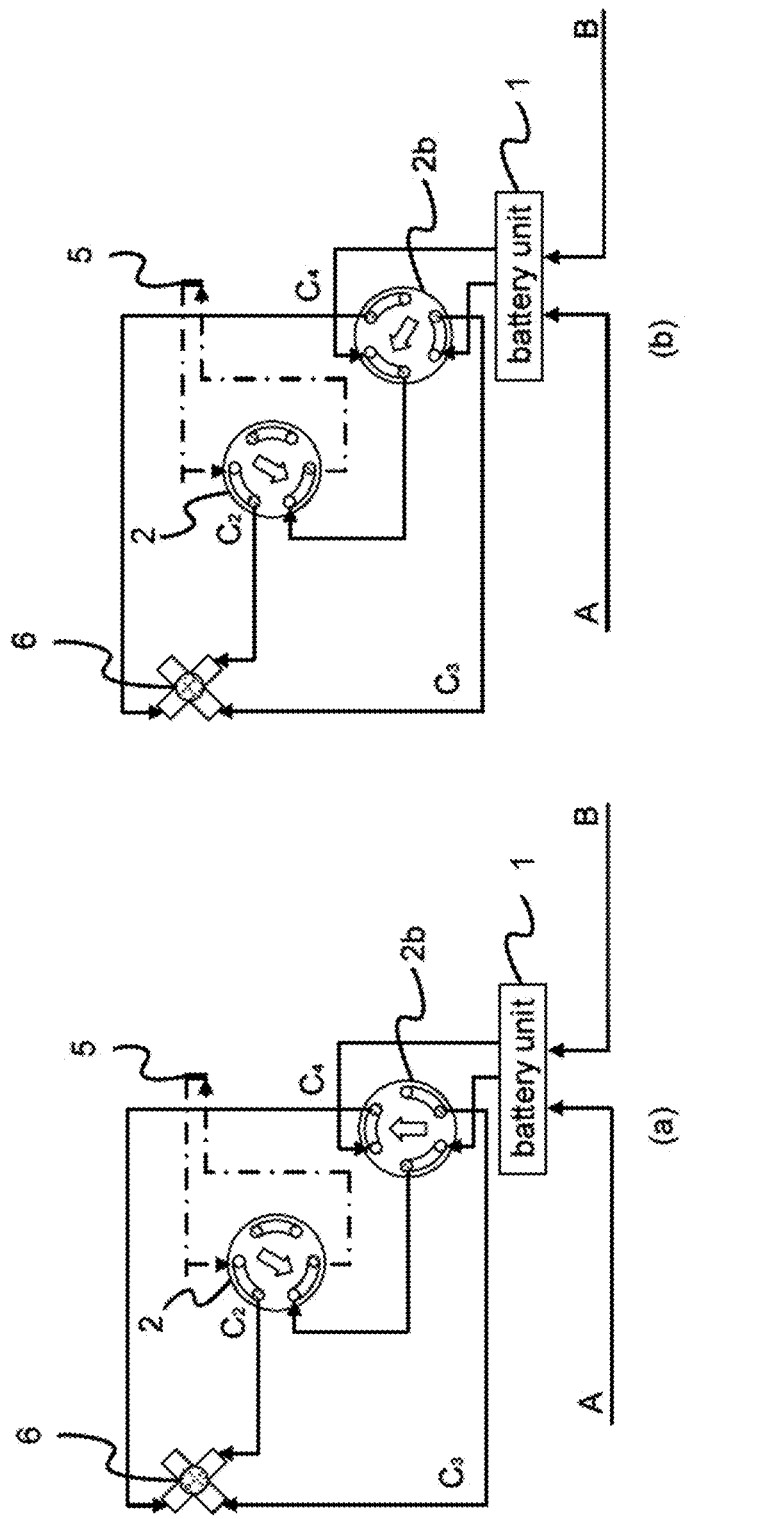
FIG. 4 is the view showing the selection of the positions of the battery unit for measuring.
Figure 5:
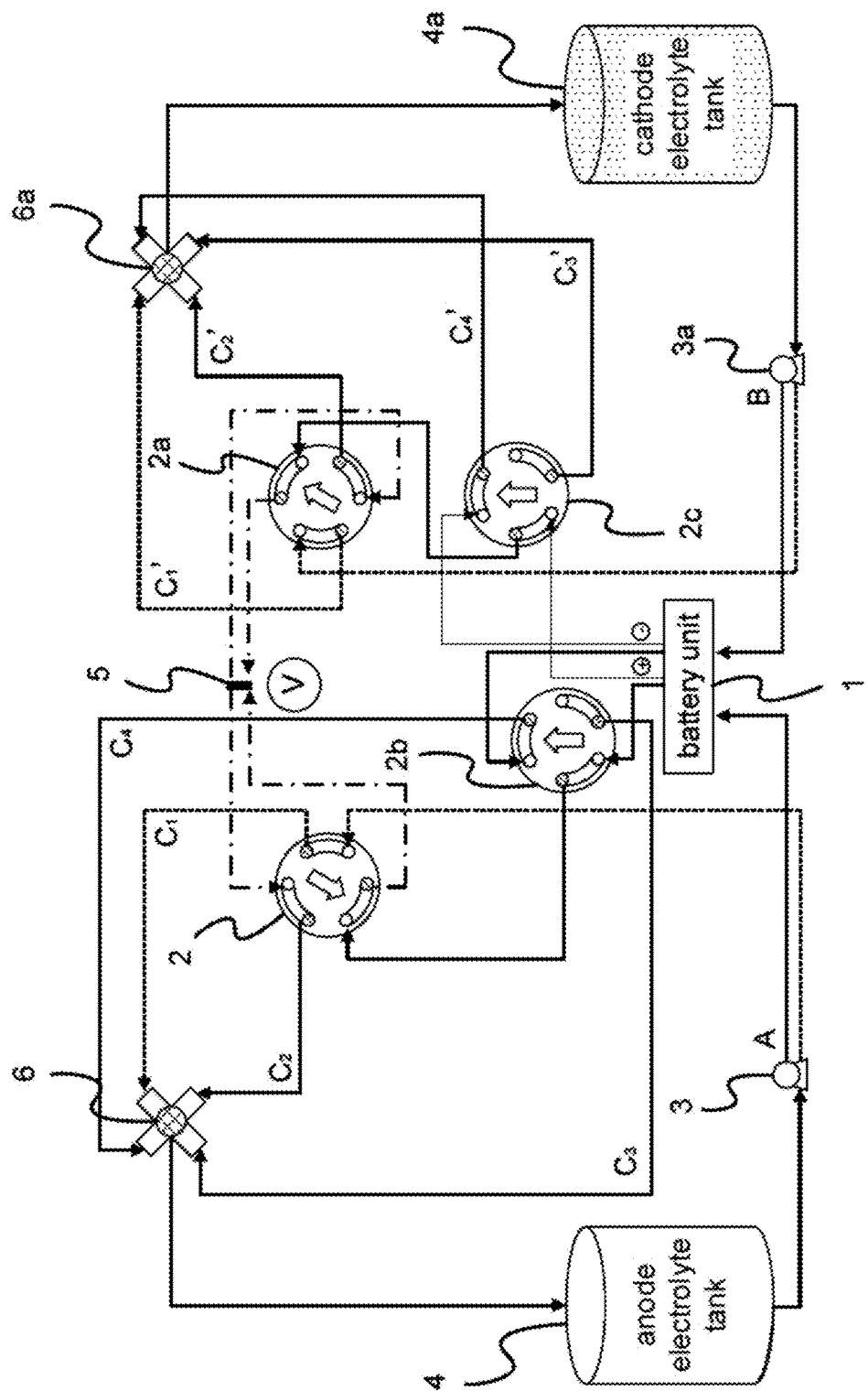
FIG. 5 is the structural view showing the measurements at the center positions of the battery unit.
Figure 6:
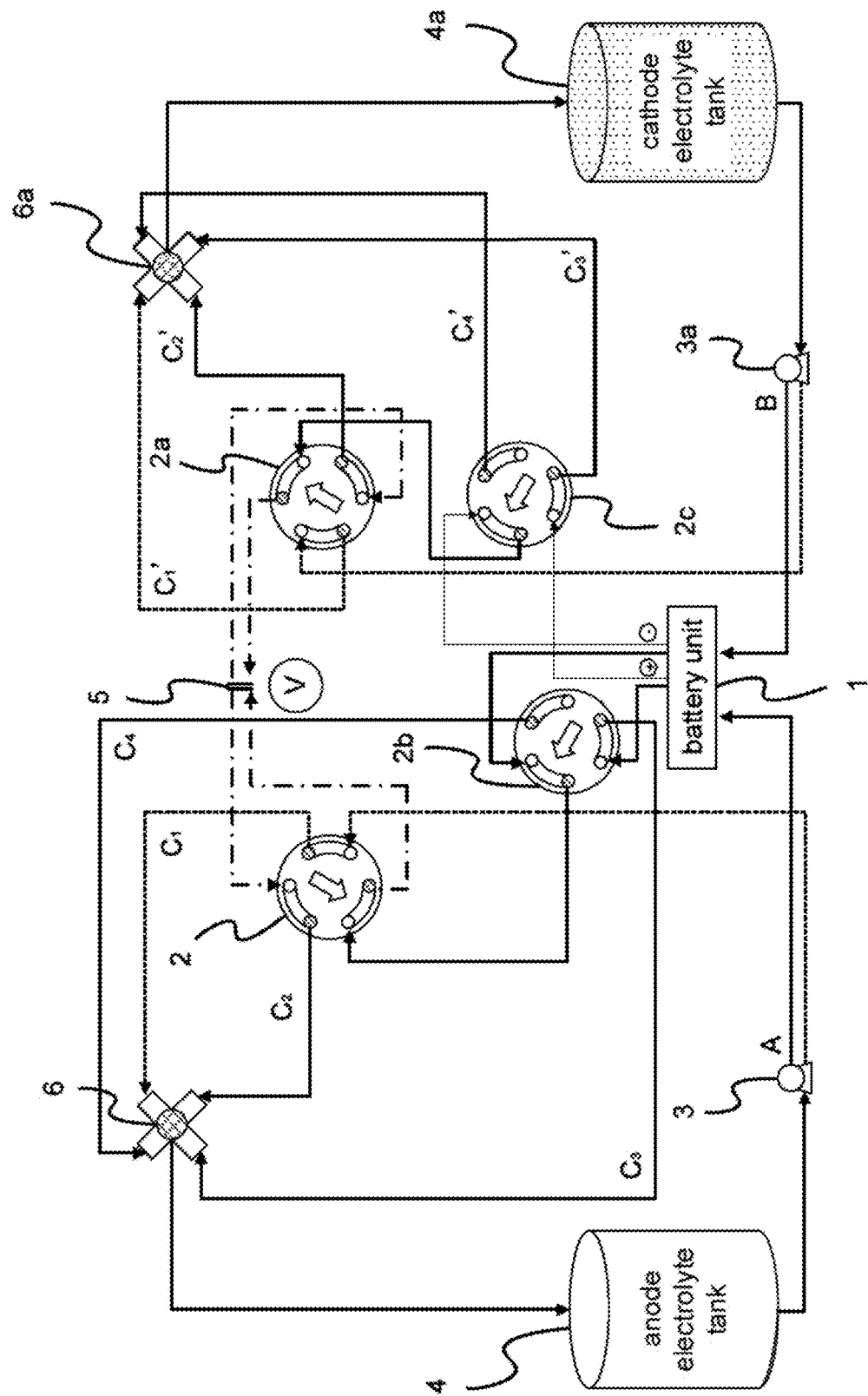
FIG. 6 is the structural view showing the measurements at the outer positions of the battery unit.

As is described above, the present invention measures the power of electrolytes at different positions through switching six-way valves without reconnecting channels. Therein, FIG. 2 and FIG. 3 show a mode of connection; FIG. 4 shows the selection of center and outer positions for measuring; and FIG. 5 and FIG. 6 show another mode of connection. By using the switching of the six-way valves only, the power of the electrolytes at different positions of a system are measured. Because the electrolytes flow in the system thoroughly, it is hard for devices existed in modern market to track the power of the electrolytes at different positions. Hence, the present invention uses the six-way valves to track the power of the electrolytes at different positions, where, on finishing the measurements at the positions, weighting data corresponding to charging states of the system are used to process weighting for figuring out accurate power. Thereby, the charging and discharging of voltage and the current of battery are controlled for constant operations in charge-discharge states with high efficiency. Thus, the efficiency of power conversion is improved; energy consumption is reduced; and the battery is ensured to be always run within a safe power-range for avoiding accidents or damages to the battery. In addition, the present invention is further applicable to a device monitoring the features of battery unit. The six-way valves can be used to monitor the power at center positions of the battery unit at real time by switching. The values measured at the positions are aimed at abnormality of the battery unit for processing adjustment or offline replacement to maintain best operation performance of the system.

To sum up, the present invention is an apparatus for electricity measurement of flow battery, where the apparatus processes measurements online with fast speed and high precision; the measurements are processed at any positions of an entire system without affecting the operation of a battery unit for online controlling the charging and discharging of the battery unit; the power at different center positions of the battery unit are monitored at real time; and the values measured at the positions are aimed at the abnormality of the battery unit for processing adjustment or offline replacement to maintain best operation performance of the system.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:
1. An apparatus of electricity measurement for flow battery, comprising
   at least one battery unit,
      wherein said battery unit has at least two feeding outlets and two material inlets to process electrochemical reactions to generate and/or discharge direct current based on electrolytes supplied and to output said electrolytes obtained after said electrochemical reactions; and said feeding outlets are located at outer positions and center positions;
   at least two six-way valves, wherein said six-way valves separately connect to said feeding outlets of said battery unit; and wherein each of said six-way valves comprises six channels, being a first channel, a second channel, a third channel, a fourth channel, a fifth channel, and a sixth channel; said six channels are 3-input/3-output channels with each neighboring two channels interconnected and are fixed on corresponding one of said six-way valves to rotate around a circle center of said corresponding one of said six-way valves as following said corresponding one of said six-way valves; and said first channel, said third channel, and said fifth channel are electrolyte inlets and said second channel, said fourth channel, and said sixth channel are electrolyte outlets;

two circulating pumps, wherein said circulating pumps separately connect to said material inlets of said battery unit and connect to corresponding ones of said electrolyte inlets of corresponding ones of said six-way valves;

two electrolyte tanks, wherein said electrolyte tanks separately connect to said circulating pumps to pump said electrolytes stored in corresponding ones of said electrolyte tanks to said battery unit through corresponding ones of said circulating pumps;

a power-measuring single cell, wherein said power-measuring single cell is connected between said second channel and said fifth channel of each of said six-way valves; and wherein, during the charging and discharging of a flow battery, power of said electrolyte tanks and power at positions of said feeding outlets of said battery unit are measured online and said positions of said feeding outlets are selected from a group consisting of said outer positions and said center positions; power at different positions are measured online by separately switching said six-way valves; values measured at different positions are weighted to be corresponding to a system power; said six-way valves are separately switched to online monitor power at different positions of said battery unit; and said values measured at different positions are obtained to process handling in advance to said battery unit having an abnormal state to maintain best system performance and said handling is selected from a group consisting of adjusting and online replacing; and two electrolyte collectors, wherein said electrolyte collectors separately connect to said electrolyte outlets of said six-way valves and connect to said electrolyte tanks to collect corresponding ones of said electrolytes being shunted and having a state selected from a group consisting of an unmeasured state and a measured state to be further flown into corresponding ones of said electrolyte tanks to be reused after being mixed.

2. The apparatus according to claim 1, wherein each of said six-way valves has a first mode and a second mode; on switching said six-way valves to said first mode, said electrolytes flow along a direction that said electrolytes flow from corresponding ones of said electrolyte tanks to corresponding ones of said circulating pumps and, then, flow to corresponding ones of said six-way valves and, then, flow to said power-measuring single cell; and, on switching said six-way valves to said second mode, said electrolytes flow along a direction that said electrolytes flow from corresponding ones of said electrolyte tanks to corresponding ones of said circulating pumps and, then, flow to said battery unit and, then, flow to corresponding ones of said six-way valves and, then, flow to said power-measuring single cell.

3. The apparatus according to claim 2, wherein, on switching said six-way valves to said second mode, said electrolytes flow along a direction that said electrolytes flow from corresponding ones of said electrolyte tanks to corresponding ones of said circulating pumps and, then, flow to corresponding ones of said feeding outlets of said battery unit at corresponding ones of said outer positions and, then, flow to corresponding ones of said six-way valves and, then, flow to said power-measuring single cell.

4. The apparatus according to claim 2, wherein, on switching a part of said six-way valves to said first mode and switching the other part of said six-way valves to said second mode, said electrolytes flow along a direction that said electrolytes flow from corresponding ones of said electrolyte tanks to corresponding ones of said circulating pumps and, then, flow to corresponding ones of said feeding outlets of said battery unit at corresponding ones of said center positions and, then, flow to corresponding ones of said six-way valves and, then, flow to said power-measuring single cell.

5. The apparatus according to claim 1, wherein flows of said electrolytes are controlled by switching said six-way valves to separately enter said power-measuring single cell in a way selected from a group consisting of a forwarding way and a reversing way.

* * * * *